United States Patent
Hong

[11] Patent Number: 5,969,384
[45] Date of Patent: Oct. 19, 1999

[54] FLASH MEMORY HAVING SEPARATE DATA PROGRAMMING AND ERASING TERMINALS

[75] Inventor: Gary Hong, Hsinchu, Taiwan

[73] Assignee: United Microelectronics Corp., Taiwan

[21] Appl. No.: 08/686,428

[22] Filed: Jul. 26, 1996

[30] Foreign Application Priority Data

Jun. 8, 1996 [TW] Taiwan ................................. 85106893

[51] Int. Cl.6 ......................... H01L 29/788; H01L 29/06
[52] U.S. Cl. ......................... 257/322; 257/321; 257/623; 438/212; 438/264; 438/268
[58] Field of Search .................... 257/321, 322, 257/623; 438/212, 264, 268

[56] References Cited

U.S. PATENT DOCUMENTS

| | | | |
|---|---|---|---|
| 5,414,287 | 5/1995 | Hong | 257/316 |
| 5,508,544 | 4/1996 | Shah | 257/316 |
| 5,633,519 | 5/1997 | Yamazaki et al. | 257/315 |

*Primary Examiner*—Olik Chaudhuri
*Assistant Examiner*—Howard Weiss
*Attorney, Agent, or Firm*—Rabin & Champagne, P. C

[57] ABSTRACT

A method of fabricating a flash memory having a vertical floating gate terminal layer and controlling gate terminal layer structure, which is suitable for use in ultra-high density IC circuits, and which has two separate tunneling layers, one used for data programming and the other used for data erasure. The fabrication method includes a number of steps. A protruding plateau is first formed on the surface of a silicon substrate. Then, ions are implanted to form a drain region on the top surface of the protruding plateau, as well as to form source regions in the substrate on each side of and adjacent to the base of the protruding plateau. A gate oxide layer is formed on each side wall of the protruding plateau; exposing only part of the side wall of the drain region. A tunnel oxide layer that is thinner than the gate oxide layer, is formed above the surface of the silicon substrate so as to cover the source regions and drain region. A floating gate terminal layer is formed on each side wall of the gate oxide layer and the drain tunneling oxide layer. A dielectric layer is then deposited over the substrate, and a controlling gate terminal layer is formed on each side wall of the dielectric layer.

20 Claims, 5 Drawing Sheets

FLASH MEMORY HAVING SEPARATE DATA PROGRAMMING AND ERASING TERMINALS

BACKGROUND OF THE INVENTION

1. Field of the Invention

The invention relates in general to the fabrication of an integrated circuit component, and more particularly to the fabrication of a flash memory designed to miniaturize the dimensions of a memory component.

2. Description of the Related Art

An electrical erasable programmable read only memory (EEPROM) is a memory component that is widely used in personal computers and electronic equipment. A conventional EEPROM memory cell has a floating gate transistor structure and has the ability to be programmed, to be erased, and to store data while connected in a circuit. These abilities give EEPROMs advantages over other types of memory. However, EEPROMs suffer from drawbacks, such as a slow storage and retrieval time (about 150 to 200 ns). Recently, a type of EEPROM with a faster storage and retrieval time (about 70 to 80 ns) has been developed, and has been coined "flash" EEPROM memory by Intel Corporation of the United States.

A conventional EEPROM has a floating gate transistor structure as shown in FIG. 1. The floating gate transistor includes a floating gate layer 10, a controlling gate layer 12, a tunnel oxide layer 14, a dielectric layer 15, a drain region 16, and a source region 18. Its operation is based on the so-called Fowler-Nordheim tunneling effect, in that electrons from the drain region 16 tunnel through the tunnel oxide layer 14 and eventually arrive and are stored in the floating gate layer 10. This has the effect of raising the threshold voltage in the floating gate transistor and enables data storage by the transistor. Alternatively, when the situation is reversed, such that the electrons in the floating gate layer are drawn out through the tunnel oxide layer into the source region 18, data is erased. The aforementioned EEPROM floating gate transistor structure has definite limitations when applied to a densely packed IC circuit. Furthermore, using the same tunnel oxide layer for both data programming and data erasure, as in this design, increases the wear rate of the transistor due to the bi-directional flow of electrons.

SUMMARY OF THE INVENTION

It is therefore an object of the invention to provide a method for fabricating flash memory such that its component dimensions can be shrunk, it is suitable for use in ultra-high density IC circuits, and it uses two separate tunneling layers, one especially for data programming and the other especially for data erasure, so that the level of wear in each component is greatly reduced.

To achieve the object stated above, the invention provides a method for fabricating flash memory which includes the following steps. First, a protruding plateau is formed on the surface of a silicon substrate. Then, an ion implantation process is performed to form a drain region on the top surface of the protruding plateau, as well as to form source regions in the substrate on either side of the base of the protruding plateau. A gate oxide layer is then formed on each side wall of the protruding plateau, so as to expose only part of the side wall of the drain region. A tunnel oxide layer, that is thinner than the gate oxide layer, is then formed over the source regions and drain region, and a floating gate terminal layer is formed on each side wall of the gate oxide layer and the tunnel oxide layer. A dielectric layer is then deposited on the substrate. Finally, a controlling gate terminal layer is formed on each side wall of the dielectric layer.

BRIEF DESCRIPTION OF THE DRAWINGS

Other objects, features, and advantages of the invention will become apparent from the following detailed description of the preferred but non-limiting embodiment. The description is made with reference to the accompanying drawings in which.

DESCRIPTION OF THE PREFERRED EMBODIMENT

FIGS. 2A to 2H are cross-sectional views showing processing steps for fabricating a flash memory according to a preferred embodiment of the invention.

Figure 1:
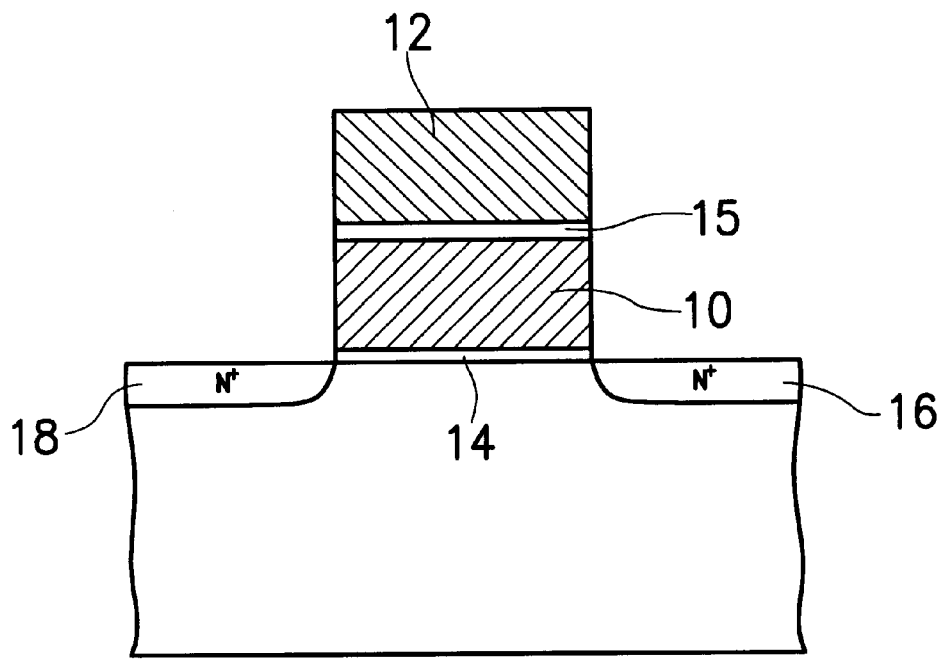
FIG. 1 is a cross-sectional view showing the floating gate transistor of a flash memory formed by a conventional technique.
Figure 2A:
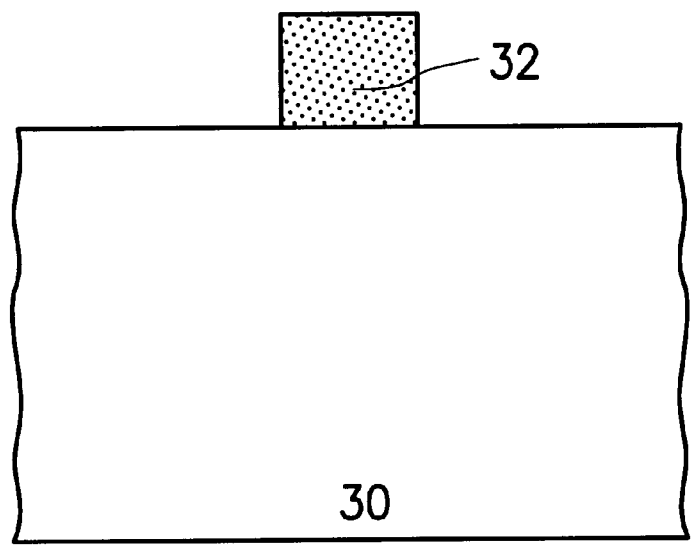
FIGS. 2A to 2H are cross-sectional views showing processing steps for fabricating a flash memory according to a preferred embodiment of the invention.
Figure 2B:
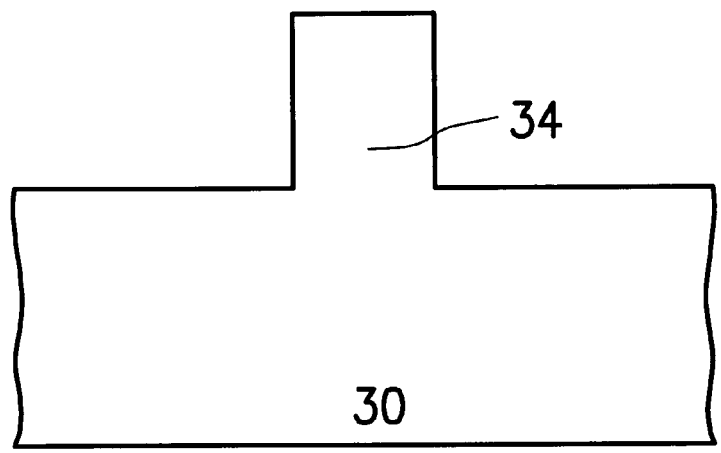

First, referring to FIG. 2A, a photoresist layer 32 is formed above a silicon substrate 30 using a photolithographic technique. The photoresist layer 32 exposes a portion of the silicon substrate 30 that will be etched. Then, referring to FIG. 2B, the portion of the silicon substrate 30 that was not covered by photoresist layer 32 is etched away, for example by a dry etching method having an etching depth between about 1000 Å and about 10,000 Å. After that, the photoresist layer 32 is removed, forming a protruding plateau 34.

Figure 2C:
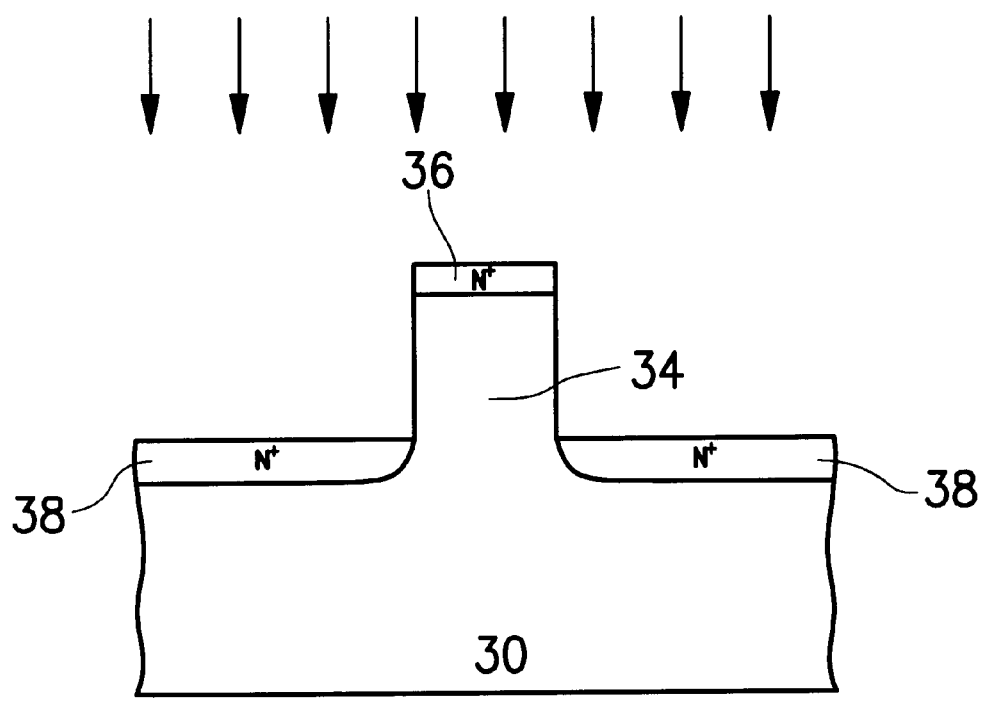

Next, referring to FIG. 2C, an ion implantation process is performed to form a drain region 36 on the top surface of the protruding plateau 34, as well as to form source regions 38 in the substrate on either side of the base of the protruding plateau 34. For example, the ion implantation process can be performed at an energy level of about 50 KeV and provide a dosage of about $1 \times 10^{15}$ ions/cm$^2$ using phosphorus or arsenic ions as a doping impurity.

Figure 2D:
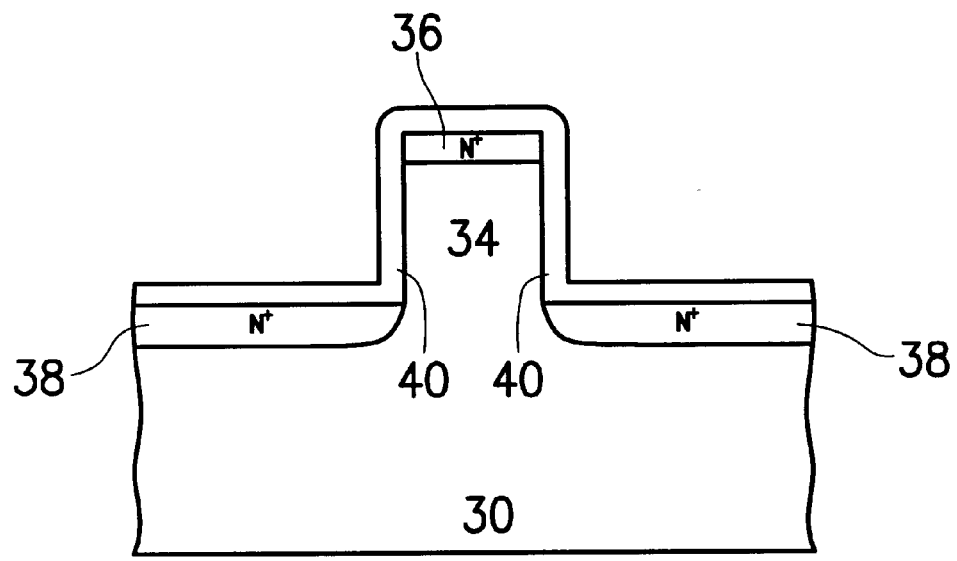
Figure 2E:
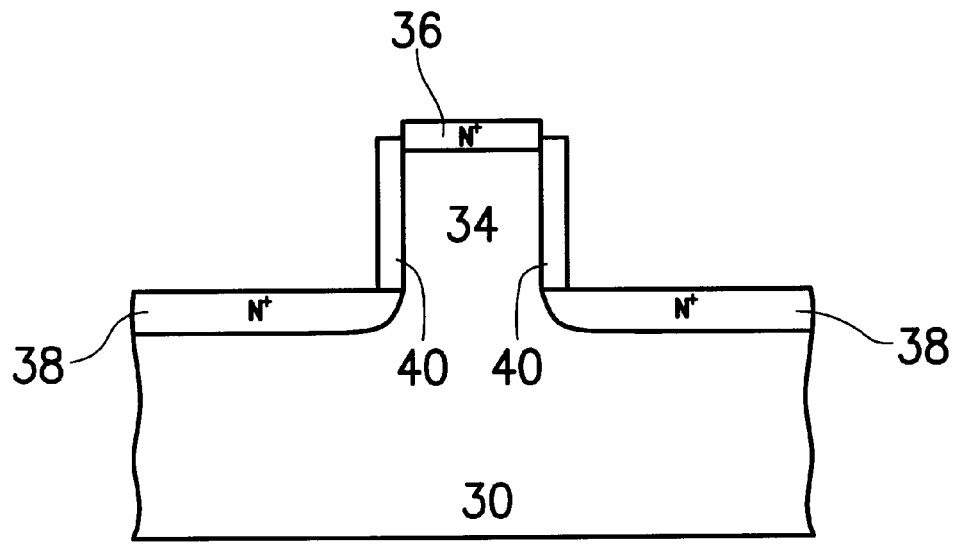

Thereafter, referring to FIG. 2D, a layer of oxide 40 is deposited over the substrate 30, covering the drain region 36 and the source regions 38. For example, a layer of silicon dioxide having a thickness of between about 100 Å and about 300 Å may be deposited in an atmosphere of oxygen and nitrogen, with reaction temperature set at about 800° C. and a reaction time set at about 20 minutes. Next, referring to FIG. 2E, part of the oxide layer 40 is selectively etched by employing a plasma dry etching method, exposing part of the drain region 36 and source regions 38, and leaving the remaining oxide layer 40 portions flanking the side walls of the protruding plateau 34 to act as an oxide layer for the gate terminal.

Figure 2F:
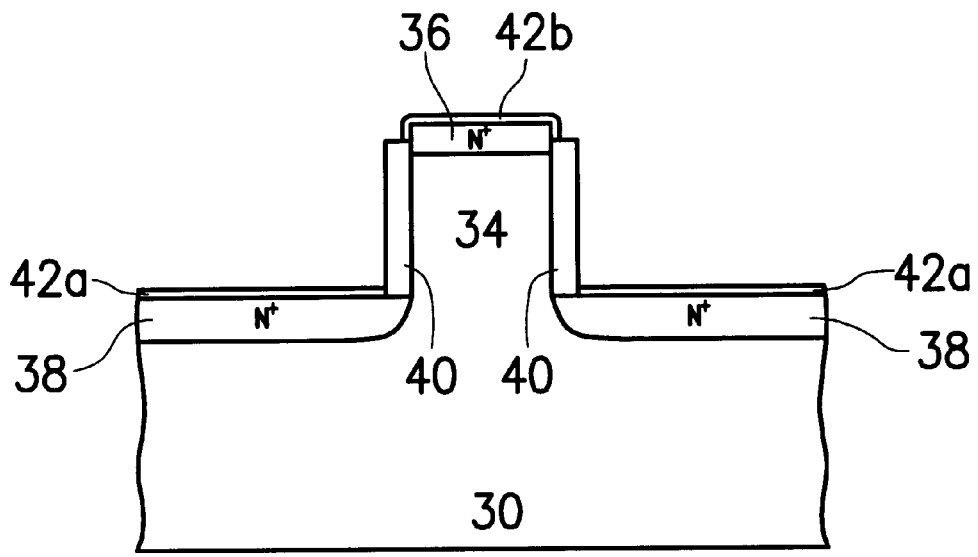
Figure 2G:
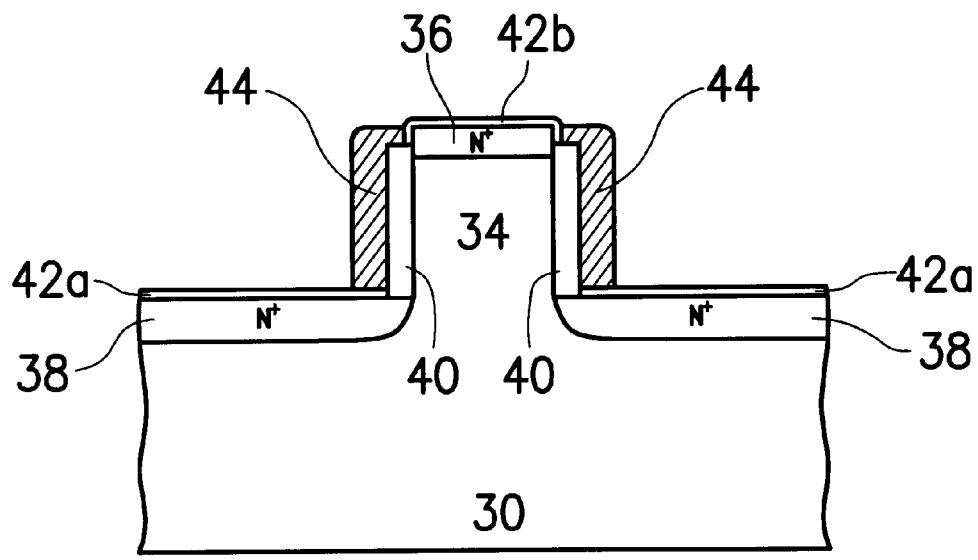

Next, referring to FIG. 2F, tunnel oxide layers 42a and 42b having a thickness between about 50 Å and about 100 Å and thinner than the oxide layer 40 are formed covering exposed portions of source regions 38 and drain region 36, respectively. Then, referring to FIG. 2G, a polysilicon floating gate terminal layer 44 is formed, for example, by performing deposition, ion implantation, and dry etching of a polysilicon layer having a thickness between about 500 Å and about 1500 Å.

Figure 2H:
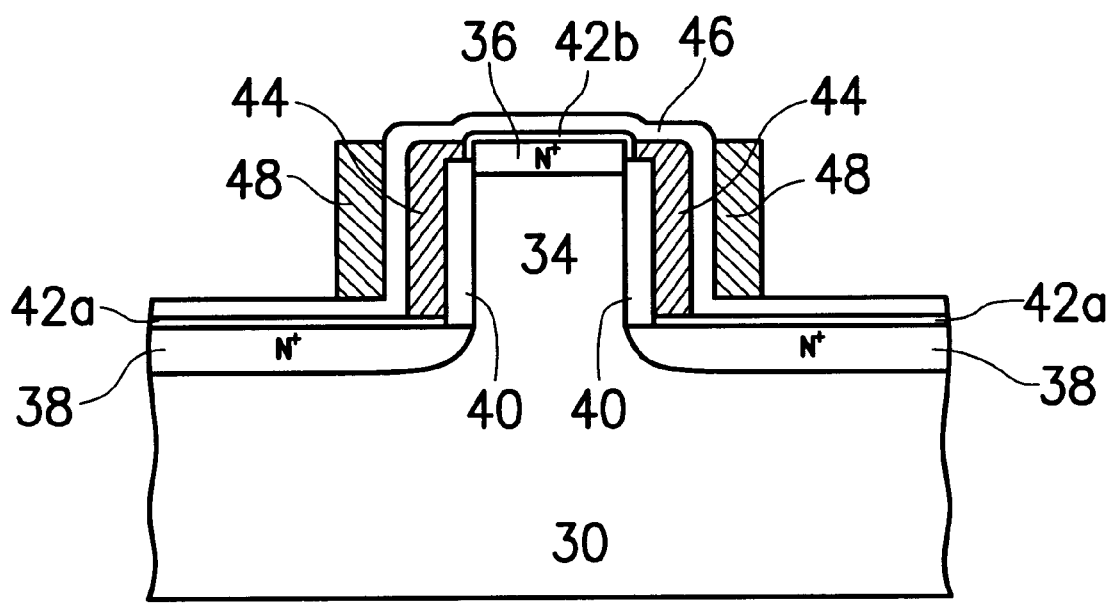

Referring to FIG. 2H, a stacked polysilicon dielectric layer 46 is formed. For example, this layer can be an oxide/nitride/oxide (ONO) three-layered structure with a deposition thickness of between about 100 Å and about 400 Å. Finally, a polysilicon controlling gate terminal layer 48 is formed on the side walls of the stacked polysilicon dielectric layer 46, for example, by performing deposition, ion implantation, and dry etching of a polysilicon layer.

In summary, a vertical design for a floating gate terminal layer and controlling gate terminal layer structure is fabricated according to the preferred embodiment of the invention, resulting in an overall dimensional reduction of the transistor component. Furthermore, by using separate tunnel oxide layers to carry out data programming and erasure, wear of the component is greatly minimized, resulting in better operational reliability.

Examples of the voltages to be applied at the different device terminals when the flash memory fabricated according to the invention is undergoing data erasure, programming, and read operations are listed in Table 1.

TABLE 1

|  | Control Gate | Drain | Source | Substrate |
| --- | --- | --- | --- | --- |
| Program | −10V | +3V | 0V | 0V |
| Read | +3V | +1V | 0V | 0V |
| Erase | +12V | floating | 0V | 0V |

Thus, when the EEPROM is programmed, a negative voltage of −10V is applied to the controlling gate terminal layer 48, a positive voltage of +3V is applied to the drain region 36, and both the source region 38 and substrate 30 are grounded. Powered in this manner, electrons flow from the floating gate terminal layer 44 and pass through the tunnel oxide layer 42b to enter the drain region 36, and therefore electrons in the floating gate terminal layer 44 diminish, resulting in a lowering of the threshold voltage. During a read operation, a positive voltage of +3V is applied to the controlling gate terminal layer 48, a positive voltage of +1V is applied to the drain region, with both the source region and substrate 30 still grounded. For those memory units that have been previously programmed, the threshold voltage is lowered and the memory cell is switched to an ON state. Those memory units that have not been previously programmed remain in an OFF state. When data must be erased, a positive voltage of +12V is applied to the controlling gate terminal layer 48, there is no voltage connection to the drain region 36, and both the source region 38 and substrate 30 are grounded. Powered in this manner, electrons will flow into the floating gate terminal layer 44 from the source region 38 via the tunnel oxide layer 42a. The number of electrons in the floating gate terminal layer 44 will increase, and after awhile will regain the former high threshold voltage level.

While the invention has been described by way of example and in terms of a preferred embodiment, it is to be understood that the invention is not limited thereto. To the contrary, it is intended to cover various modifications and similar arrangements. The appended claims, therefore, should be accorded the broadest interpretation so as to encompass all such modifications and similar structures.

What is claimed is:

1. A flash memory, comprising:
    a protruding plateau on a surface of a silicon substrate, wherein the protruding plateau has a base, a top surface, and sidewalls;
    a drain region, having sidewalls and being disposed on the top surface of the protruding plateau;
    source regions, in the substrate adjacent to the base of the protruding plateau;
    a gate oxide layer on the sidewalls of the protruding plateau, wherein the gate oxide layer has sidewalls and is disposed such that only a portion of each of the sidewalls of the drain region is exposed;
    a tunnel oxide layer having a first portion over the source regions and a second portion over the drain region, wherein the tunnel oxide layer is thinner than the gate oxide layer;
    a floating gate terminal layer on the sidewalls of the gate oxide layer and in direct contact with the first portion and the second portion of the tunnel oxide layer;
    a dielectric layer, having sidewalls and being disposed over the substrate; and
    a controlling gate terminal layer on the sidewalls of the dielectric layer.

2. A flash memory according to claim 1, wherein the protruding plateau has a thickness of between about 1000 Å and about 10,000 Å.

3. A flash memory according to claim 1, wherein the gate oxide layer has a thickness of between about 100 Å and about 300 Å.

4. A flash memory according to claim 1, wherein the tunnel oxide layer has a thickness of between about 50 Å and about 100 Å.

5. A flash memory according to claim 1, wherein the floating gate terminal layer is a polysilicon layer.

6. A flash memory according to claim 5, wherein the floating gate terminal layer has a thickness of between about 500 Å and about 1500 Å.

7. A flash memory according to claim 1, wherein the dielectric layer is a three-layered structure of oxide/nitride/oxide.

8. A flash memory according to claim 7, wherein the dielectric layer has a thickness of between about 100 Å and about 400 Å.

9. A flash memory according to claim 1, wherein the controlling gate terminal layer is a polysilicon layer.

10. A flash memory according to claim 1, wherein the first portion of the tunnel oxide layer provides a first tunneling region directly between the drain region and the floating gate terminal layer, and the second portion of the tunnel oxide layer provides a second tunneling region directly between the source regions and the floating gate terminal layer.

11. A flash memory for the programmable storage of data, comprising:
    a protruding plateau on a surface of a silicon substrate, wherein the protruding plateau has a base, a top surface, and first and second sidewalls;
    a drain region, having first and second sidewalls and being disposed on the top surface of the protruding plateau;
    a program source region in the substrate, disposed adjacent to a first side of the base of the protruding plateau;
    an erase source region in the substrate, disposed adjacent to the base of the protruding plateau on a second side of the base opposite the first side of the base;
    a first gate oxide layer on the first sidewall of the protruding plateau, wherein the first gate oxide layer has a sidewall and covers only a portion of the first sidewall of the drain region;
    a second gate oxide layer on the second sidewall of the protruding plateau, wherein the second gate oxide layer has a sidewall and covers only a portion of the second sidewall of the drain region;
    a first tunnel oxide layer over the program source region, wherein the first tunnel oxide layer is thinner than the first gate oxide layer and further is thinner than the second gate oxide layer;

a second tunnel oxide layer over the erase source region, wherein the second tunnel oxide layer is thinner than the first gate oxide layer and further is thinner than the second gate oxide layer;

a third tunnel oxide layer over the drain region, wherein the third tunnel oxide layer is thinner than the first gate oxide layer and further is thinner than the second gate oxide layer;

a program floating gate terminal layer on the sidewall of the first gate oxide layer and the first tunnel oxide layer;

an erase floating gate terminal layer on the sidewall of the second gate oxide layer and the second tunnel oxide layer;

a dielectric layer, having first and second sidewalls and being disposed over the substrate;

a program controlling gate terminal layer on the first sidewall of the dielectric layer, for accepting a first voltage input to control programming of data to be stored on the flash memory; and an erase controlling gate terminal layer on the second sidewall of the dielectric layer, for accepting a second voltage input to control erasing of data stored on the flash memory.

12. A flash memory according to claim 11, wherein the protruding plateau has a thickness of between about 1000 Å and about 10,000 Å.

13. A flash memory according to claim 11, wherein the first and second gate oxide layers each have a thickness of between about 100 Å and about 300 Å.

14. A flash memory according to claim 11, wherein the first, second, and third tunnel oxide layers each have a thickness of between about 50 Å and about 100 Å.

15. A flash memory according to claim 11, wherein the first and second floating gate terminal layers are polysilicon layers.

16. A flash memory according to claim 15, wherein the first and second floating gate terminal layers each have a thickness of between about 500 Å and about 1500 Å.

17. A flash memory according to claim 11, wherein the dielectric layer is a three-layered structure of oxide/nitride/oxide.

18. A flash memory according to claim 17, wherein the dielectric layer has a thickness of between about 100 Å and about 400 Å.

19. A flash memory according to claim 11, wherein the first and second controlling gate terminal layers are polysilicon layers.

20. A flash memory according to claim 11, wherein the first tunnel oxide layer provides a first tunneling region directly between the program source region and the program floating gate terminal layer, the second tunnel oxide layer provides a second tunneling region directly between the erase source region and the floating gate terminal layer, and the third tunnel oxide layer provides a third tunneling region directly between the drain region and the floating gate terminal layer.

* * * * *